US010033251B2

(12) United States Patent
Mønster et al.

(10) Patent No.: US 10,033,251 B2
(45) Date of Patent: Jul. 24, 2018

(54) ELECTRICAL MOTOR

(71) Applicant: GRUNDFOS HOLDING A/S, Bjerringbro (DK)

(72) Inventors: Peter Mønster, Randers C (DK); Lars Østergaard, Randers NV (DK)

(73) Assignee: GRUNDFOS HOLDING A/S, Bjerringbro (DK)

( * ) Notice: Subject to any disclaimer, the term of this patent is extended or adjusted under 35 U.S.C. 154(b) by 565 days.

(21) Appl. No.: 14/372,096

(22) PCT Filed: Feb. 19, 2013

(86) PCT No.: PCT/EP2013/053291
§ 371 (c)(1),
(2) Date: Jul. 14, 2014

(87) PCT Pub. No.: WO2013/135466
PCT Pub. Date: Sep. 19, 2013

(65) Prior Publication Data
US 2015/0002002 A1    Jan. 1, 2015

(30) Foreign Application Priority Data
Mar. 15, 2012 (EP) .................................... 12159620

(51) Int. Cl.
*H02K 5/10* (2006.01)
*H02K 11/00* (2016.01)
(Continued)

(52) U.S. Cl.
CPC ..... *H02K 11/0068* (2013.01); *F04D 13/0686* (2013.01); *H02K 5/10* (2013.01);
(Continued)

(58) Field of Classification Search
USPC ...................................................... 310/71, 89
See application file for complete search history.

(56) References Cited

U.S. PATENT DOCUMENTS 3,959,692 A * 5/1976 Wetzel ............... G05D 23/2401
219/497
4,092,512 A * 5/1978 Suzuki ................. H02K 49/108
219/754
(Continued)

FOREIGN PATENT DOCUMENTS

DE        101 07248 A1     7/2002
DE     102005016905 B3    11/2006
(Continued)

OTHER PUBLICATIONS

WILO Katalog A2—Trockenlauferpumpen, 2009.
(Continued)

*Primary Examiner* — Naishadh Desai
(74) *Attorney, Agent, or Firm* — McGlew and Tuttle, P.C.

(57) ABSTRACT

An electric motor with an electronics housing (6) includes a removable cover (10) as well as an operating unit. The operating unit includes an operating panel (20) fastened on the cover (10). The cover (10) with the operating panel (20) is connectable to a lower part (8) of the electronics housing (6) in at least two alternative alignments. A pump assembly is also provided with such an electric motor.

20 Claims, 2 Drawing Sheets

(51) Int. Cl.
  *F04D 13/06* (2006.01)
  *H05K 7/14* (2006.01)
  *H02K 5/22* (2006.01)
  *H02K 11/30* (2016.01)
  *H02K 11/33* (2016.01)

(52) U.S. Cl.
  CPC .............. *H02K 5/22* (2013.01); *H02K 5/225* (2013.01); *H02K 11/30* (2016.01); *H02K 11/33* (2016.01); *H05K 7/1432* (2013.01)

(56) References Cited

U.S. PATENT DOCUMENTS

| | | | |
|---|---|---|---|
| 6,198,183 B1* | 3/2001 | Baeumel | F04D 25/068 310/52 |
| 2006/0145550 A1* | 7/2006 | Yamamoto | F02B 63/04 310/89 |
| 2007/0177366 A1* | 8/2007 | Stewart | H02K 11/33 361/791 |
| 2009/0004035 A1* | 1/2009 | Steegmuller | B60T 8/368 417/423.14 |
| 2013/0294949 A1* | 11/2013 | Blaser | F04D 15/0218 417/410.1 |

FOREIGN PATENT DOCUMENTS

| | | |
|---|---|---|
| DE | 10 2008 033859 A1 | 1/2010 |
| EP | 1 385 254 A2 | 1/2004 |
| EP | 1 947 343 A1 | 7/2008 |
| JP | 2000 133 104 A | 5/2000 |
| WO | 2010/009704 A2 | 1/2010 |

OTHER PUBLICATIONS

Einbau—und Betriebsanleitung WILO-CronoLine IL-E, Feb. 2011.
Einbau—und Betriebsanleitung WILO-VeroLine IP-E, May 2010.
Einbau—und Betriebsanleitung WILO-Stratos PICO. Jun. 2011.
Fotos einer WILO-Stratos PICO.
BOPLA, Gehausemagazin.
BOPLA, Alu-Topline, Auszug aus, the red book.
Einbau—und Betriebsanleitung WILO-CronoLine IL, Sep. 2010.

* cited by examiner

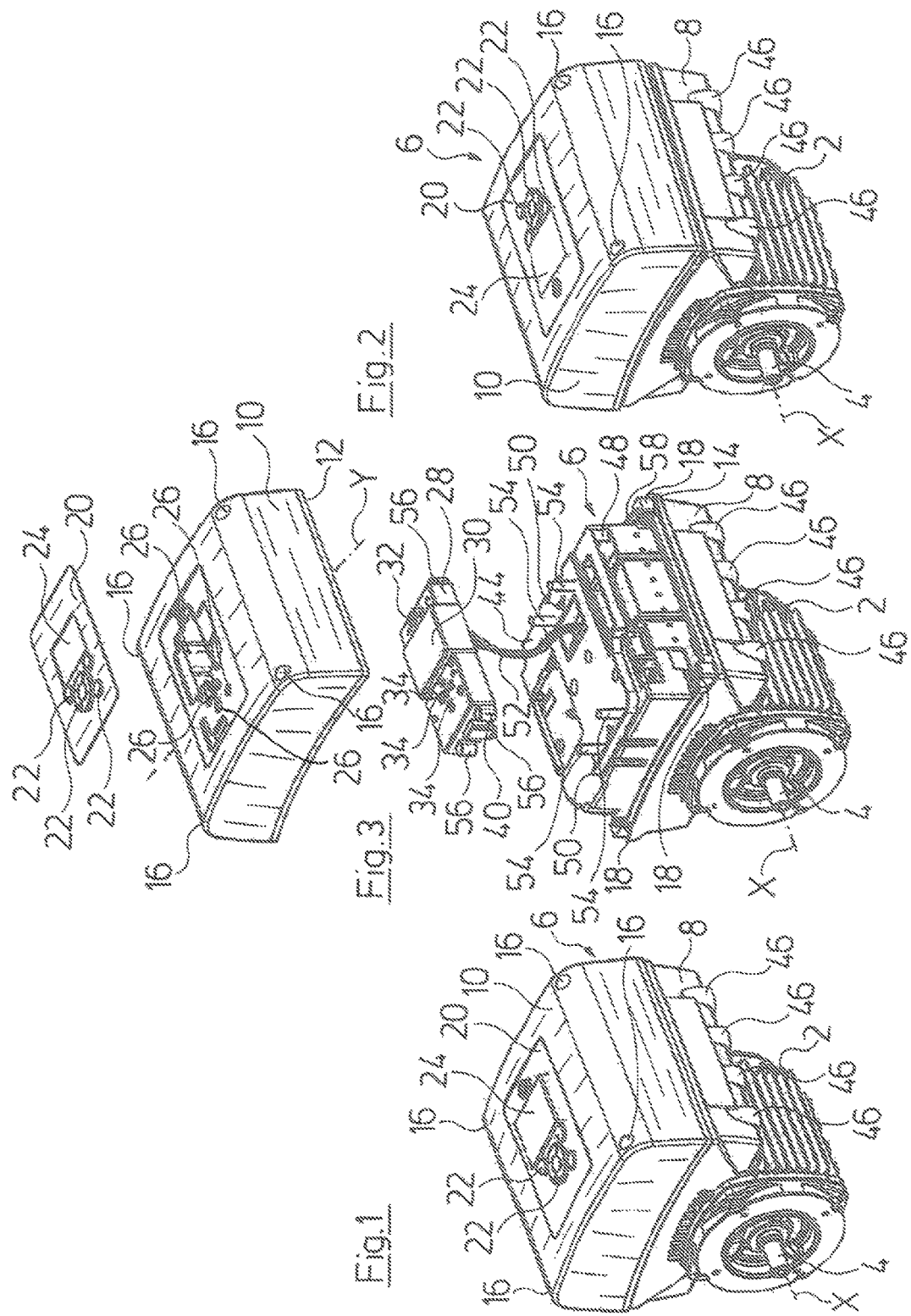

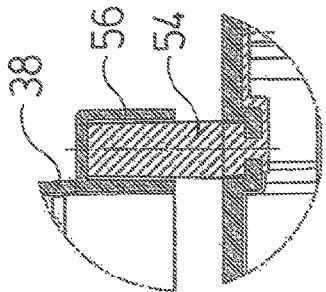
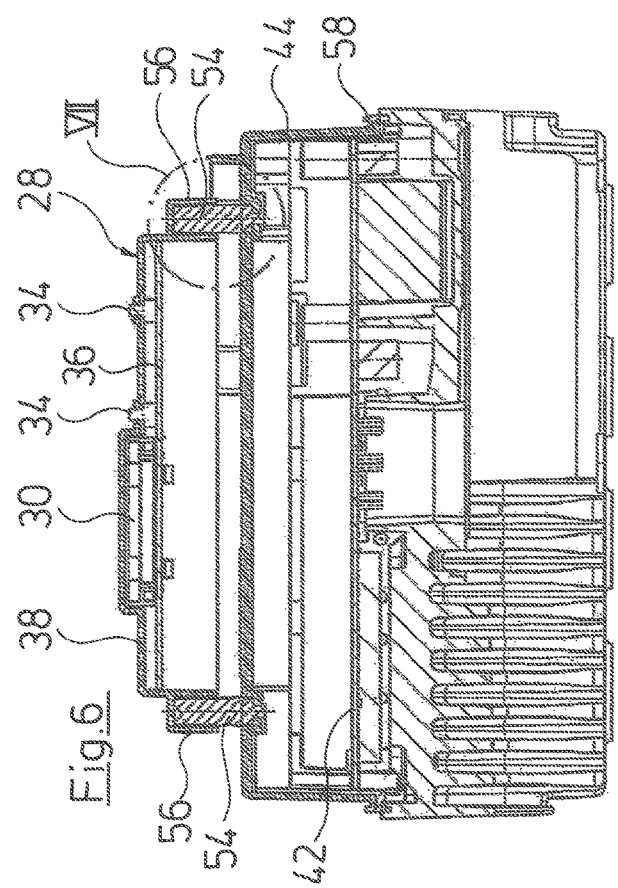
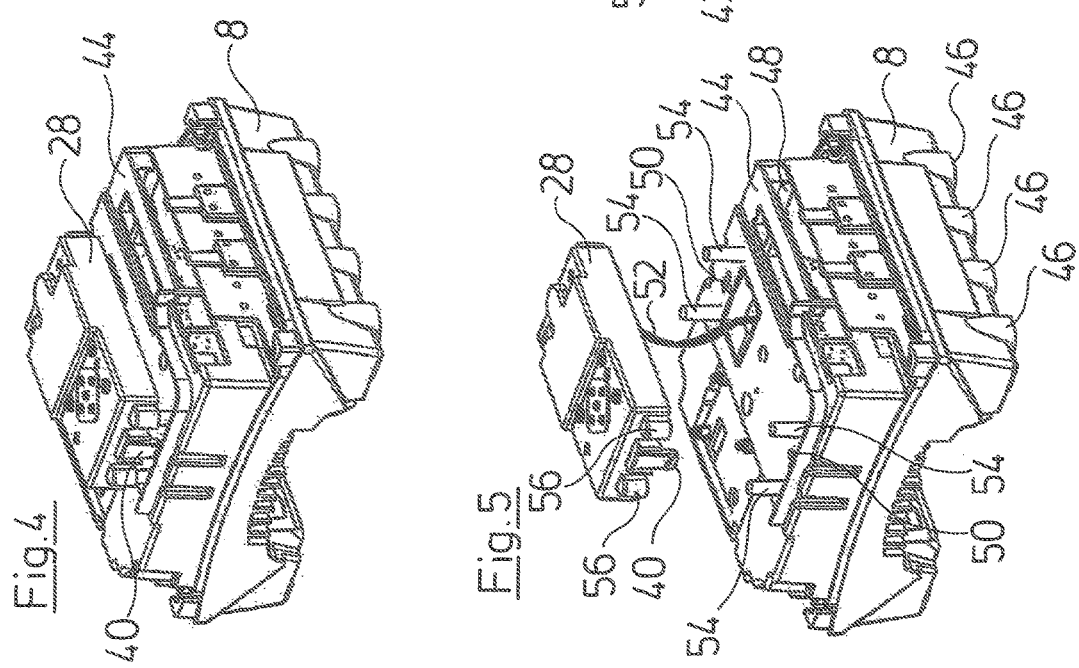

ELECTRICAL MOTOR

CROSS REFERENCE TO RELATED APPLICATIONS

This application is a United States National Phase Application of International Application PCT/EP2013/053291 filed Feb. 19, 2013 and claims the benefit of priority under 35 U.S.C. § 119 of European Patent Application EP 12159620.9 filed Mar. 15, 2012, the entire contents of which are incorporated herein by reference.

FIELD OF THE INVENTION

The invention relates to an electric motor with an electronics housing which comprises a removable cover as well as an operating unit, as well as to a pump assembly with such an electric motor.

BACKGROUND OF THE INVENTION

Electric motors as a rule comprise a stator housing and an electronics housing attached on the stator housing. Electronic control elements for the control or for the drive of the electric motor are arranged in the electronics housing. In particular, a frequency converter can be arranged in the electronics housing. Moreover, such electronics housings as a rule comprise an operating unit, at which necessary settings can be carried out for operating the electric motor and moreover display elements can be provided, in order to display certain operating conditions of the electric motor.

Such operating units as a rule are aligned such that they can be optimally observed and viewed from a certain side of the electric motor. In particular, possible inscriptions and display elements are aligned such that they can be read from a certain side. This is disadvantageous if the electric motor in operation needs to be set up such that it cannot be operated or viewed from this certain side. Then there is the problem that the operating unit can only be observed the other way round.

SUMMARY OF THE INVENTION

It is therefore an object of the invention, to improve an electric motor with an electronics housing, to the extent that the operating unit can be read and operated in a simple manner from different directions.

According to the invention, an electric motor is provided with an electronics housing which comprises a removable cover as well as an operating unit. The operating unit comprises an operating panel fastened on the cover. The cover, with the operating panel, is connectable to a lower part of the electronics housing in at least two alternative alignments.

According to a further aspect of the invention, a pump assembly is provided with an electric drive motor. The electric drive motor is the above-mentioned electric motor.

The electric motor according to the invention, in the known manner, comprises an electronics housing. In particular, control elements and other electronic elements and other electronic components for the control or for the operation of the electric motor can be arranged in this electronics housing. Particularly preferably, a frequency converter can also be arranged in the electronics housing. The electronics housing is preferably fastened on the outer side of a stator housing of the electric motor. Moreover, the electronics housing comprises a removable cover. The cover can, for example, be removed, in order to be able to connect electrical connection leads in the inside of the electronic housing. This, for example, can be a mains connection lead and/or a connection lead for the connection to external sensor elements or control elements. The cover preferably closes the electronics housing at an upper side which is away from the stator housing. Moreover, an operating unit is arranged on the cover, via which operating unit settings of operating conditions of the electric motor can be carried out and which moreover comprises display elements for the display of operating conditions of the electric motor.

According to the invention, one envisages the operating unit having an operating panel fastened on the cover. The operating panel is thereby that component which can be observed from the outside and on which possibly present operating elements such as push buttons or likewise are arranged. This operating panel is preferably fixedly connected to the cover, so that together with the cover it can be removed from the electronics housing. According to the invention, the cover with the operating panel is now connectable in at least two alternative alignments, to a lower part of the electronics housing. I.e. the operating panel of the operating unit can be aligned differently in a simple manner, by way of the cover being connected to the lower part of the electronics housing in alternative alignments. For example, the cover can be connectable, for example screwed to the lower part at two positions rotated by 90° or 180°. Thus, the operating panel together with the cover can also be rotated by 90° or 180°. Thus, depending on the installation position of the electric motor, the operating panel with the cover can be fastened on the lower part of the electronics housing in that one of the alternative alignments, in which the operating panel can be optimally viewed. The fixed arrangement of the operating panel on the cover thereby has the advantage that no further assembly steps are necessary for aligning the operating panel when setting up and assembling the electric motor, since the cover must be removed in any case for the connection of electrical connection leads and then subsequently can be simply fastened on the lower part of the electronics housing again in the desired alignment.

Preferably, the interfaces of the cover which come into contact with the lower part are designed mirror-symmetrically to a middle line or symmetry axis of the cover, in order to permit an alignment in two alternative alignments rotated by 180°. This permits the cover to be fastened on the lower part in a manner rotated by 180° about a rotation axis, wherein the rotation axis extends normally to the middle line of the cover and intersects this. The interfaces which come into contact with the lower part are the bearing-contact surfaces or bearing-contact edges of the cover, which come to bear on corresponding bearing-contact surfaces or bearing-contact edges of the lower part. Moreover, these are the fastening elements such as screws and corresponding screw holes or threaded holes. In particular, these screws and threaded holes are arranged symmetrically to one another such that the cover can always be fastened on the lower part with the same fastening elements in all alternative alignments. Thus, no additional fastening elements are necessary for the different alignments. With the rotation of the cover from a first alignment into the second alignment, then for example a screw does not engage into a first threaded hole but into a second, oppositely lying threaded hole, and the screw, which in the first alignment would engage into the second oppositely lying threaded hole, accordingly engages into a first threaded hole.

According to a further preferred embodiment, the operating unit apart from the operating panel comprises an electronics unit which is arranged in the lower part in a manner separated from the cover and which cooperates with the operating panel. The electronics unit is not connected to the cover and preferably contains display elements as for example a display or LED, and operating elements such as electrical switch elements or buttons. The operating panel is designed such that the display elements, which are arranged on the electronics unit, can be seen through the operating panel. Windows or fibre-optics can be provided in the operating panel for this. Moreover, mechanical operating elements are provided in the operating panel, which act on electrical switch elements in the electronics unit, for example electrical switches or buttons. A transmission of the switch function can be effected mechanically or for example also by way of magnetic coupling.

Particularly preferably, the operating panel is designed as a purely mechanical component which is free of electrical components. This has the advantage that the operating panel can be separated from the electronics unit without any problem. Thus, no connection whatsoever, in particular no electrical connection between the cover and the lower part and the electronics housing is necessary, so that the cover can easily be completely removed. The electronics unit can remain with the remaining electronic components in the inside of the terminal box or the electronics housing in its lower part.

Thereby, the electronics unit in the lower part is preferably fastenable in at least two alignments corresponding to the alternative alignments of the cover. This, when e.g. the cover is rotated into a second alternative alignment, permits the electronics unit, which comes to lie below the cover, to also be able to be aligned in the lower part accordingly in a second alternative alignment, so that the electronics unit always retains a predefined alignment relative to the operating panel which is connected to the cover, independently of the envisaged several alternative alignments of the cover, in which the cover is fastened on the lower part. The electronics unit is always accordingly aligned in the lower part before fastening the cover.

The electronics unit for this can be fixed in the lower part via at least one locking element. This permits the electronics unit to be easily released and to be able to be fixed in the desired alignment or angular position in the lower part, without a special tool being necessary for this. Alternatively or additionally, the electronics unit can be secured in the lower part, for example also by way of screws.

The operating panel is further preferably provided with at least one transparent window, and the electronics unit with at least one display element which is placed below this window. Such a display element can be a display such as a LED display or LCD display or an illumination element such as an LED. With regard to the display, as the case may be, it can be the case of a touch-sensitive display, wherein then the transparent window of the operating panel is designed such that it does not hinder the touch-sensitive function of a display lying therebelow or such that it supports this function as the case may be. The transparent windows can be completely transparent or partly transparent. Moreover, the windows can also be colored and/or carry inscriptions which, as the case may be, are not visible until the display element has been switched on. This can be achieved by way of a part-transparent design which does not contrast with the surroundings in the switched-off condition of the display element, so that the window is only visible in the illuminated condition.

Further preferably, the operating panel comprises at least one elastically deformable push region and the electronics unit comprises at least one electrical switch element placed below this push region. By way of pressure onto the push region, this can be deformed such that the push region acts on an electrical switch element lying therebelow, in the electronics unit, for example on a switch or button on the electronics unit. Thus, a purely mechanical connection between the push region of the operating panel and an electrical switch element in the electronics unit is achieved. Thus, no electrical connections to the operating panel for any operating elements, which are to be operable for the outside, are necessary. Thus, the operating panel with the cover can be designed in a manner in which it can be easily separated from the electronics unit.

The electronics unit for its part is preferably electrically connected via at least one plug connection and/or cable connection to further electronic components arranged in the lower part. These further electronic components can in particular be arranged on a circuit board, to which the electronics unit is connected via the plug connection or cable connection. The plug connection can be designed such that it can engage at several angular positions. Alternatively, one can design several plug connections, wherein the electronics unit then, depending on the selected alignment, can become electrically conductively engaged with one of these several plug connections in the lower part of the terminal box. Alternatively, a cable connection can be formed, which permits a rotatability or alignment ability of the electronics unit at different angular positions or alignments. Thereby, only the cable connection between the electronics units and the further electronic components or a circuit board moves.

According to a further preferred embodiment, the electronics unit via at least one spring element is held in bearing contact on the operating panel and/or in bearing contact on an inner side of the cover. This is advantageous, in order to be able to ensure the desired interaction of the operating panel with the electronics unit. For this, the electronics unit must preferably be held in a defined position to the operating panel, in particularly be arranged adequately close to the operating panel, so that for example deformable push regions of the operating panel can act on electric switch elements in the electronics unit, and display elements are visible from the outside through windows in the operating panel. The spring elements can thereby compensate occurring tolerances between the electronics unit and the operating panel, which can result for example also from the fastening of the cover. In particular, if a seal is arranged between the cover and the lower part and is deformed on fastening the cover, one cannot ensure that the distance between the cover and the lower part is always the same in an exactly defined manner. Certain distance fluctuations can be then compensated by the at least one spring element, so that the electronics unit is always held with the desired bearing contact on the operating panel and/or on the inner side of the cover. Particularly preferably, several spring elements, in particular three or four spring elements are present, in order to impinge the electronic unit with force in a uniform manner.

The at least one spring element is further preferably fastened on a covering which is arranged in the inside of the electronics housing and which covers electronic components arranged in the lower part, to the cover. Thereby, the covering is preferably arranged such that electrical connection leads or connection terminals which are required in order to connect connection leads such as for example a mains lead and/or control or data leads which are to be connected to the electronics housing are not covered. Thus, by way of the covering, it is ensured that on removal of the cover, the electrical components in the electronics housing remain protected by the covering and merely the necessary connection elements are freely accessible after removal of the cover. The electronics unit is preferably fastened via the spring elements on this covering, i.e. the at least one spring element is preferably fastened on the covering.

The electronics unit for its part can in turn be arranged in a separate enclosure or in a separate housing, which protects the electronic components of the electronics unit. Thus, electronic components of the electronics unit are in particular protected if the cover is removed from the lower part of the electronics housing. Thus, the electronic components of the electronics unit cannot be inadvertently damaged, for example when connecting connection leads in the inside of the terminal box. As the case may be, necessary electrical switch elements can be arranged in the known manner in openings or recesses of such a housing of the electronics unit.

Particularly preferably, the at least one spring element is an elastomer element. Such an elastomer element can be manufactured in a very simple and inexpensive manner. Moreover, the elastomer element can be preferably designed as one piece with a seal arranged on the covering. Such a seal on the one hand can seal the covering with respect to the housing walls of the lower part of the electronics housing, so that the electronic components are arranged below the covering in a sealed-off space. On the other hand, the seal is preferably in bearing contact with the lower part and the cover in a sealing manner, when the cover is put onto the lower part. I.e. the seal extends between the bearing-contact surfaces between the cover and the lower part and serves for sealing off the inner space which is enclosed by the lower part and the cover, to the outside. An elastomer element which serves as a spring element, together with such a seal can be easily formed directly on the covering with injection molding, so that an inexpensive and simple manufacture is possible.

The operating panel is preferably arranged on an outer side of the cover, and the cover below the operating panel has at least one opening, so that display elements below the cover, i.e. display elements which are situated on the electronics unit, are visible from the outside through the operating panel and the cover. Deformable push regions can thus also act through the opening in the cover onto electrical switch elements on the electronics unit. The operating panel is preferably fastened on the outer side of the cover by way of an adhesive connection. Simultaneously, a tight connection is thus created, so that the opening in the cover is sealed to the outside.

Thereby, the operating panel further preferably on its surface which is away from the electronics unit has a closed cover film. This on the one hand leads to an optically pleasant appearance of the operating field. On the other hand, the operating panel is easy to clean from the outside, since a smooth surface is thus created. Moreover, no openings or gaps are in the operating panel, into which openings or gaps contamination or for example moisture can penetrate.

Particularly preferably an electric motor according to the preceding description is applied as an electric drive motor in a pump assembly, for example in a single-stage or multi-stage centrifugal pump assembly. Such a pump assembly with such an electric motor as has been previously described is accordingly likewise the subject matter of the invention.

The invention is hereinafter described by way of example and by way of the attached figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1 is a perspective entire view of an electric motor according to the invention;

FIG. 2 is a view according to FIG. 1, with which the cover is fastened on the electronics housing in an alignment which is rotated by 180°;

FIG. 3 is an exploded view of the electric motor according to FIGS. 1 and 2;

FIG. 4 is an opened perspective view of the electronics housing;

FIG. 5 is a view of the electronics housing according to FIG. 4 with a released electronics unit;

FIG. 6 is a sectioned view through the opened electronic housing; and

FIG. 7 is a view of the detail VII in FIG. 6.

DESCRIPTION OF THE PREFERRED EMBODIMENTS

Referring to the drawings in particular, the electric motor according to the invention comprises a stator housing, in which the stator and rotor of the electric motor are arranged in the known manner. A rotor shaft 4 extends out of the stator housing 2 to the outside at one axial side. With respect to the rotation axis X of the electric motor, an electronics housing 6 is arranged on the radial side on the stator housing 2 on the outer periphery of this stator housing. The electronics housing 6 consists of a lower part 8 which is connected, in particular screwed, to the stator housing 2, and of a cover 10 which covers or closes the lower part 8 at its side which is away from the stator housing 2. For this, the cover 10 with its peripheral edge 12 comes to bear on a peripheral edge or end-edge 14 of the lower part 18. The cover 10 is fastened on the lower part 8 via four screws which engage into the screw holes 16 of the cover 10 and through these into threaded holes 18 in the lower part 8. The cover 10 is designed in a mirror-symmetric manner to the Y-axis in the region of its peripheral edge 12 and in the arrangement of the screw holes 16. This permits the cover 10 to be fastened on the lower part 8 in two arrangements which are rotated by 180° to one another, as is shown in FIGS. 1 and 2. In FIG. 1, the cover 10 is fastened on the lower part 8 in a first alignment and in FIG. 2 in a second alignment rotated by 180°.

The cover 10 on its upper side away from the lower part 8 carries an operating panel 20 of an operating unit. The operating panel 20 is designed as a film element of plastic and is bonded to the cover 10, so that it is fixedly connected to the cover 10. As is to be recognized in FIGS. 1 and 2, the operating panel 20 together with the cover 10 is aligned differently, depending on the angular position, in which the cover 10 is fastened on the lower part 8. Thus, it is to be recognized that in FIG. 1, the operating elements in the form of push regions 22 are situated on the left in the picture, whilst the same operating elements in the form of the push regions 22 in the alignment according to FIG. 2 are situated on the right in the view. Apart from the push regions 22, the operating panel 20 also comprises a window 24 which is designed in a transparent manner. Openings or recesses 26 are formed in the cover 10, below the window 24 and the push regions 22 of the operating panel 20. The openings 26 are covered over and tightly closed by way of the operating panel 20, which is fastened on the outer side of the cover 10. The operating panel 20 represents a purely mechanical component without electrical elements and with the cover 10 can be completely removed from the lower part 8. Below the cover 10 and there below the operating panel 20, an electronics unit 28 is arranged in the inside of the electronics housing and together with the operating panel 20 forms the operating unit. The electronics unit 28 carries a display 30, LED 32 and electrical switch elements 34 in the form of buttons. The switch elements 34 thereby lie below the push regions 22 of the operating panel 20 so that with a pressure on the push regions 22, these can be deformed in the direction of the electronics unit 28 and press onto the switch elements 34. The display 30 lies below the window 24 and the LEDs 32 lie below a transparent further region of the operating panel 20, so that they can illuminate through the operating panel 20.

The electronics unit 28 in its inside comprises a circuit board 36, on which the display 30, the switch elements 34 and the LED 23 are arranged and electronic components of the operating unit are attached. The circuit board 36 is arranged below a covering or in a housing 38 and is fastened in this housing 38. The housing 38 is preferably designed in a completely transparent manner and covers the display 30 and the LEDs 32 and comprises openings, through which the switch elements 34 extend to the outside towards the operating panel 20. The housing 38 moreover comprises locking elements in the form of locking hooks 40, with which the electronics unit 28 is fastened in the lower part 8.

A circuit board 42 which carries electronic components, in particular electronic components of a frequency converter, is arranged in the lower part 8. The circuit board 42 is covered by a covering 44 for the protection of this circuit board 42 and the electronic components. The covering 44 in particular serves for protecting the circuit board 42 and the electronic components when the cover 10 is removed. The cover 10 in particular is removed when electric connection leads which are led through cable feed-throughs 46 into the inside of the electronics housing 6, are to be connected onto corresponding connection elements on the circuit board 42. The covering 44 comprises openings 48, through which respective connection leads can be connected on connection elements on the circuit board 42 which are not shown in detail here.

The electronics unit 28 is fixed with the locking hooks 40 in locking recesses 50 in the covering 44. Thereby, locking recesses 50 are provided, which are likewise arranged in a mirror-symmetrical manner with respect to the symmetry axis Y. This permits the electronics unit 28 to also be fastened on the covering 44 with two alignments which are rotated by 180°. Thus, the electronics unit 28 can be fixed on the covering 44 in a manner matching the alignment of the cover 10, so that the display 30 is always situated below the window 24, and the switch elements 34 below the push regions 26 of the operating panel 20. The electrical connection between the circuit board 36 and the circuit board 42 is thereby created by way of a cable connection 52, which permits a rotation of the electronics unit 28 by 180° relative to the covering 44 and the circuit board 42 which is arranged below this.

Spring elements in the form of elastomer elements 54 are provided, in order to hold the electronics unit 28 in bearing contact on the inner side of the cover 10 and in particular to hold the switch elements 34 in bearing contact with the push regions 22 of the operating panel 20. The elastomer elements 54 extend in a column-like manner outwards away from the covering 4 and are aligned parallel to one another. Thereby, four elastomer elements 54 are provided, of which in each case two are arranged symmetrically to the symmetry axis Y. The elastomer elements 54 engage into the receiver 56 on the housing 38 of the electronics unit 28. Thereby, the receivers 58 are open to the covering 44. Likewise four receivers 56 are provided, of which in each case likewise two are arranged mirror-symmetrically to the symmetry axis Y. This permits the electronics unit 28 with its housing 38 to be put onto the elastomer elements 54 alternatively in two angular positions which are rotated by 180° to one another.

The locking connection between the locking hooks 4 and the locking recesses 50 is designed with play, so that the elastomer elements 54 are compressed when the locking hooks 40 engage into the locking recesses 50. Moreover, so much play is provided in the locking connection, that even after engagement of the locking hooks 40 into the locking recesses 50, the electronics unit 28 can be moved further onto the covering 44 by way of pressure. Firstly, the electronics unit 28 as is shown in FIG. 4 is fixed on the covering 44 via the locking connection. Subsequently, the cover is stuck onto the lower part 8 in the alignment or angular position corresponding to the selected alignment of the electronics unit 28. Thereby, the inner side of the cover 10 comes into contact with the upper side of the electronics unit 28 or its housing 38 and presses the electronics unit 28 by way of further compression of the elastomer elements 54 against the spring force of the elastomer elements 54, further towards the covering 44. In this manner, a secure bearing contact of the electronics unit 28 on the inner side or outer side of the operating panel 20 or the inner side of the cover 10 in the region of the operating panel 20 is ensured.

The elastomer elements 54 are integrally formed on the covering 44 and are designed as one piece with a seal 58 on the outer periphery of the covering 44. The seal 58 comes to bear between the lower part 8 and the cover 10 in the region of their peripheral edges 12 and 14 and seals the gap between the cover 10 and the lower part 8. The seal 58 thus together with the elastomer elements 54 can be formed on the covering 44 by way of injection molding.

While specific embodiments of the invention have been shown and described in detail to illustrate the application of the principles of the invention, it will be understood that the invention may be embodied otherwise without departing from such principles.

The invention claimed is:

1. An electric motor comprising:
   an electronics housing comprising an electronics housing lower part and an electronics housing removable cover; and
   an operating unit comprising an operating panel fastened on the electronics housing removable cover, and the electronics housing removable cover with the operating panel is connectable to the electronics housing lower part of the electronics housing in at least two alternative alignments, the operating panel comprising user actuated operating elements, wherein the operating panel is visible from a position outside of the electronics housing, wherein the operating unit, apart from the operating panel, comprises an electronics unit which is arranged in the electronics housing lower part in a manner separated from the electronics housing removable cover and which cooperates with the operating panel.

2. An electric motor according to claim 1, further comprising:
a stator housing, the electronics housing lower part being connected to the stator housing, the electronics housing lower part and the electronics housing removable cover defining an interior space for one or more electronic components when the electronics housing removable cover is in contact with the electronics housing lower part, the stator housing comprising a stator housing interior space, wherein a stator and a rotor of the electric motor are arranged in the stator housing interior space, the electronics housing removable cover having an electronics housing outer surface, said electronics housing outer surface defining an operating panel recess, at least a portion of the operating panel being arranged in the operating panel recess, wherein interfaces of the electronics housing removable cover which come into contact with the electronics housing lower part are formed mirror-symmetrically to a middle line of the electronics housing removable cover.

3. An electric motor according to claim 1, wherein the operating panel is a purely mechanical component which is free of electric components.

4. An electric motor according to claim 1, wherein the electronics unit can be fastened in at least two alignments, each of the at least two alignments corresponding to one of the at least two alternative alignments of the electronics housing removable cover, in the electronics housing lower part.

5. An electric motor according claim 1, wherein the electronics unit is fixed in the electronics housing lower part via at least one locking element.

6. An electric motor according to claim 1, wherein the operating panel is provided with at least one transparent window, and the electronics unit is provided with at least one display element which is placed below the window.

7. An electric motor according to claim 1, wherein the operating panel is provided with at least one elastically deformable push region, and the electronics unit comprises at least one electrical switch element which is placed below the push region.

8. An electric motor according to claim 1, wherein the electronics unit is electrically connected via at least one plug connection and/or cable connection to further electronic components arranged in the electronics housing lower part.

9. An electric motor according to claim 1, wherein the electronics unit via at least one spring element is held in bearing contact on the operating panel and/or in bearing contact on the inner side of the electronics housing removable cover.

10. An electric motor according to claim 9, wherein the at least one spring element is fastened on a covering which is arranged in the inside of the electronics housing and covers electronic components arranged in the electronics housing lower part, to the cover.

11. An electric motor according to claim 9, wherein the at least one spring element is an elastomer element.

12. An electric motor according to claim 10, wherein the elastomer element is designed as one piece with a seal which is arranged on the covering and which is preferably in sealingly bearing contact with the electronics housing lower part and the electronics housing removable cover.

13. An electric motor according to claim 1, wherein the operating panel is arranged on an outer side of the electronics housing removable cover, and the electronics housing removable cover, below the operating panel, comprises at least one opening.

14. An electric motor according to claim 1, wherein the operating panel on an operating panel surface, which is away from the electronics unit, comprises a closed cover film.

15. A pump assembly with an electric drive motor, wherein the electric drive motor is an electric motor comprising:
an electronics housing comprising an electronics housing lower part and an electronics housing removable cover; and
an operating unit comprising an operating panel fastened on the electronics housing removable cover, and the electronics housing removable cover with the operating panel is connectable to the electronics housing lower part of the electronics housing in at least two alternative alignments, wherein the operating panel is visible from a position outside of the electronics housing, the operating panel comprising a user interface, wherein the operating unit, apart from the operating panel, comprises an electronics unit which is arranged in the electronics housing lower part in a manner separated from the electronics housing removable cover and which cooperates with the operating panel.

16. A pump assembly according to claim 15, further comprising:
a stator housing, the electronics housing lower part being connected to the stator housing, the electronics housing lower part and the electronics housing removable cover defining an interior space for one or more electronic components when the electronics housing removable cover is in contact with the electronics housing lower part, the stator housing comprising a stator housing interior space, wherein a stator and a rotor of the electric motor are arranged in the stator housing interior space, the electronics housing removable cover having an electronics housing outer surface, said electronics housing outer surface defining an operating panel recess, at least a portion of the operating panel being arranged in the operating panel recess, wherein interfaces of the electronics housing removable cover which come into contact with the electronics housing lower part are formed mirror-symmetrically to a middle line of the electronics housing removable cover.

17. An pump assembly according to claim 15, wherein the operating panel is a purely mechanical component which is free of electric components.

18. An pump assembly according to claim 15, wherein the electronics unit can be fastened in the electronics housing lower part in at least two alignments corresponding to the alternative alignments of the electronics housing removable cover.

19. An electric motor comprising:
an electronics housing comprising an electronics housing lower part and an electronics housing removable cover;
an operating unit comprising an operating panel fastened on the electronics housing removable cover, and the electronics housing removable cover with the operating panel is connectable to the electronics housing lower part of the electronics housing in at least two alternative alignments, the operating panel comprising user actuated operating elements, wherein the operating panel is visible from a position outside of the electronics housing; and
a stator housing, the electronics housing lower part being connected to the stator housing, the electronics housing lower part and the electronics housing removable cover defining an interior space for one or more electronic components when the electronics housing removable cover is in contact with the electronics housing lower part, the stator housing comprising a stator housing interior space, wherein a stator and a rotor of the electric motor are arranged in the stator housing interior space, the electronics housing removable cover having an electronics housing outer surface, said electronics housing outer surface defining an operating panel recess, at least a portion of the operating panel being arranged in the operating panel recess, wherein interfaces of the electronics housing removable cover which come into contact with the electronics housing lower part are formed mirror-symmetrically to a middle line of the electronics housing removable cover.

20. A pump assembly with an electric drive motor, wherein the electric drive motor is an electric motor comprising:
   an electronics housing comprising an electronics housing lower part and an electronics housing removable cover;
   an operating unit comprising an operating panel fastened on the electronics housing removable cover, and the electronics housing removable cover with the operating panel is connectable to the electronics housing lower part of the electronics housing in at least two alternative alignments, wherein the operating panel is visible from a position outside of the electronics housing, the operating panel comprising a user interface; and
   a stator housing, the electronics housing lower part being connected to the stator housing, the electronics housing lower part and the electronics housing removable cover defining an interior space for one or more electronic components when the electronics housing removable cover is in contact with the electronics housing lower part, the stator housing comprising a stator housing interior space, wherein a stator and a rotor of the electric motor are arranged in the stator housing interior space, the electronics housing removable cover having an electronics housing outer surface, said electronics housing outer surface defining an operating panel recess, at least a portion of the operating panel being arranged in the operating panel recess, wherein interfaces of the electronics housing removable cover which come into contact with the electronics housing lower part are formed mirror-symmetrically to a middle line of the electronics housing removable cover.

* * * * *